United States Patent [19]
Kadyk

[11] Patent Number: 6,166,666
[45] Date of Patent: Dec. 26, 2000

[54] METHOD AND APPARATUS FOR COMPRESSION AND ENCODING OF UNICODE STRINGS

[75] Inventor: Don Kadyk, Bothell, Wash.

[73] Assignee: Microsoft Corporation, Redmond, Wash.

[21] Appl. No.: 09/175,795

[22] Filed: Oct. 19, 1998

[51] Int. Cl.$^7$ ................................ H03M 7/30
[52] U.S. Cl. ................................ 341/87
[58] Field of Search ................ 341/87; 345/467

[56] References Cited

U.S. PATENT DOCUMENTS

| 5,444,445 | 8/1995 | Chu | 341/87 |
|---|---|---|---|
| 5,784,071 | 7/1998 | Tang et al. | 345/467 |
| 5,793,381 | 8/1998 | Edberg et al. | 345/467 |

OTHER PUBLICATIONS

U.S. application No. 08/825,643, Ginsberg, filed Apr. 3, 1997.
U.S. application No. 08/869,913, Bennett, filed Jun. 5, 1997.
"Unicode Technical Report #6: A Standard Compression Scheme for Unicode, Revision 2.0", retrieved from internet: http://www.unicode.org/unicode/reports/tr6/tr6-2.html, p. 1-13 (Sep. 30, 1998).

"Coping with File Formats on the Internet", Computer Communications, vol. 20, No. 16, pp. 1437-1447 (Jan. 1, 1998).

*Primary Examiner*—Trong Phan
*Attorney, Agent, or Firm*—Westman, Champlin & Kelly, P.A.

[57] ABSTRACT

A method in a computer system examines a string of two-byte characters and determines if the first byte in each of the two-byte characters is the same. If the first byte is the same in each of the two-byte characters, the method converts the string of two-byte characters into a string of one-byte values by removing the first byte of each of the two-byte characters. A designation value is then concatenated to the string of one-byte values to indicate the value of the first byte removed from each two-byte character.

28 Claims, 8 Drawing Sheets

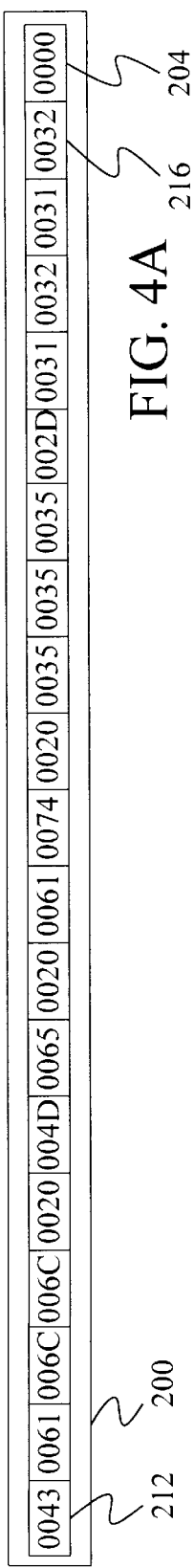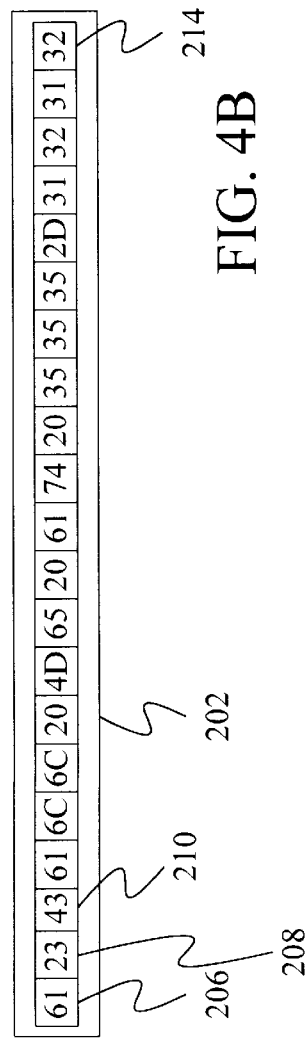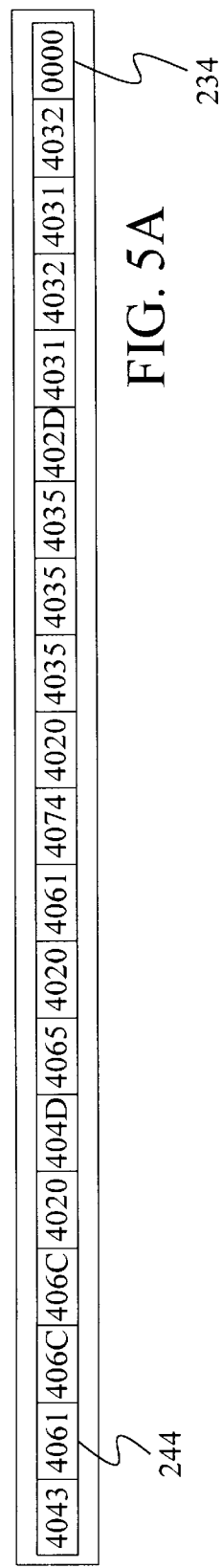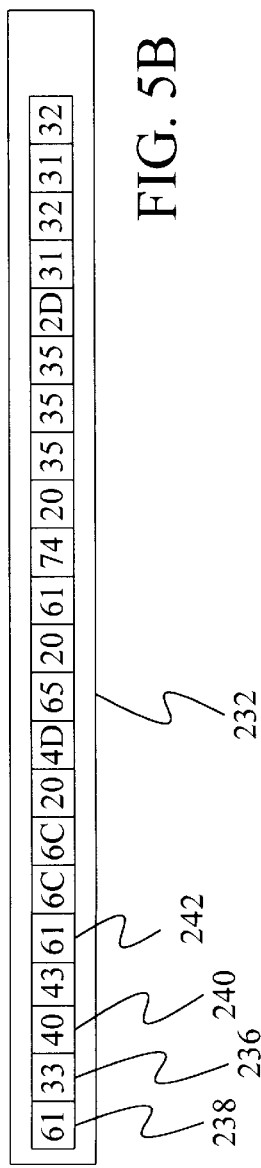

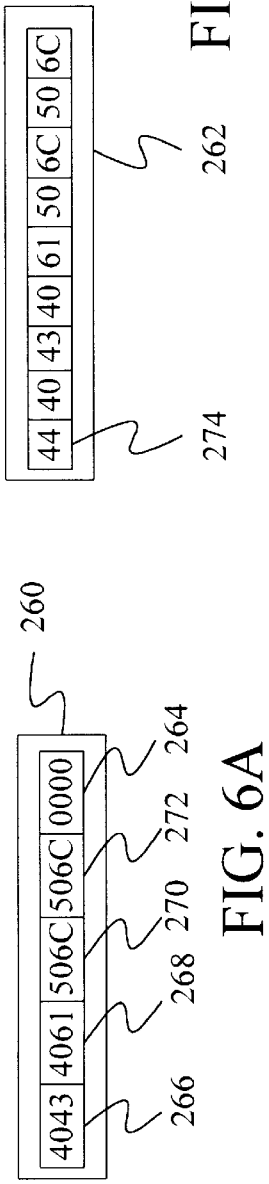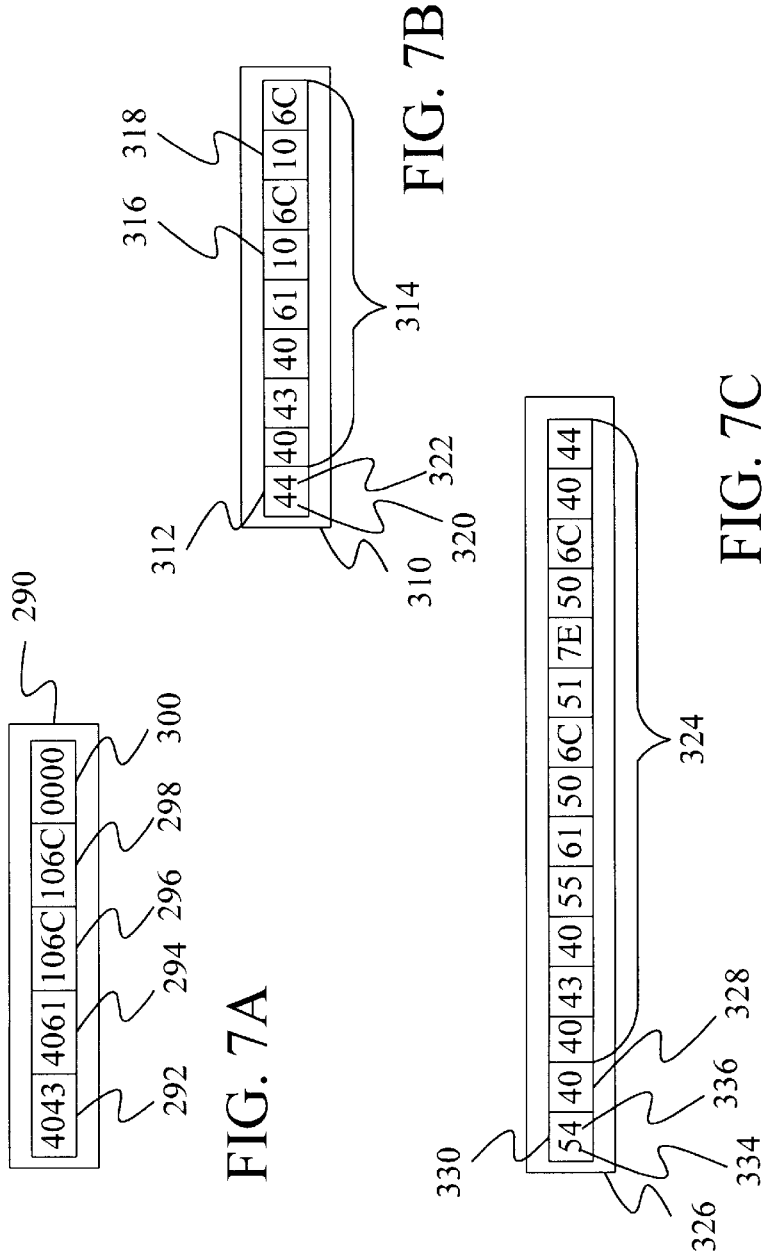

METHOD AND APPARATUS FOR COMPRESSION AND ENCODING OF UNICODE STRINGS

BACKGROUND OF THE INVENTION

The present invention relates to compression and encoding. In particular, the present invention relates to compression of Unicode strings.

In computing environments, it is desirable to represent symbols and characters found in human language as hexadecimal values. The collection of hexadecimal values needed to represent an entire language is known as a character set. In order to accommodate all of the symbols found in the various languages throughout the world, the computing community developed the Unicode character set that uses two bytes to represent any one character or symbol.

In order to allow portability of computer objects, it is preferred that computer programs that manipulate language characters be written to manipulate Unicode characters. Although this Unicode standard increases the portability of computer programs, it is incompatible with certain communication channels that only allow the transmission of certain values. In particular, it is incompatible with channels that require that each byte of channel information be within the range of characters found in the printable American Standard Code for Information Interchange (ASCII), which is limited to values between 20 hexadecimal and 7E hexadecimal.

To overcome this incompatibility, the art has developed encoding methods for converting hexadecimal bytes into printable "ASCII" characters. One such method is known as UUencode and involves dividing the stream of data into three-byte sequences and then dividing each of the three-byte sequence into four six-bit values. Two "0" bits are placed in front of each of the four six-bit values to produce eight-bit values that are added to "20" hexadecimal. This produces four eight-bit values that are between "20" hexadecimal and "5F" hexadecimal. Note that under UUencoding, each three-byte sequence is converted into a four-byte sequence resulting in a thirty-three percent increase in the size of the data. Thus, three Unicode characters, which are together represented by six bytes, would be converted into eight bytes of UUencoded data.

To overcome this increase in data size, some prior art systems have used compression algorithms to compress the UUencoded data. Typically, the compression algorithms reduce the size of the data by finding identical bit sequences in the data. For each set of identical bit sequences, the compression algorithm keeps the first bit sequence and replaces the other matching sequences with a value indicating the length of the replaced sequence and a value indicating the location of the first bit sequence that matches the replaced sequence.

Although such compression algorithms work well with large strings of data, they do not work well with short data strings because the redundancy of short data strings is low. In fact, in some cases, compression algorithms can cause the data to increase in size due to overhead data that must be added to the compressed data string to indicate the type of compression that was performed.

SUMMARY OF THE INVENTION

A method in a computer system examines a string of two-byte characters and determines if the first byte in each of the two-byte characters is the same. If the first byte is the same in each of the two-byte characters, the method converts the string of two-byte characters into a string of one-byte values by removing the first byte of each of the two-byte characters. A designation value is then concatenated to the string of one-byte values to indicate the value of the first byte removed from each two-byte character.

In one embodiment of the invention, if the first byte in each of the two-byte characters is not the same, the two-byte characters are divided into one-byte characters. In other embodiments of the invention, the string of one-byte characters is examined to determine if every character in the string is within the printable "ASCII" range. If a character is not within the printable "ASCII" range, the entire string is UUencoded.

BRIEF DESCRIPTION OF THE DRAWINGS

FIGS. 4A and 4B show the conversion of a first Unicode string under an embodiment of the present invention.

FIGS. 5A and 5B show the conversion of a second Unicode string under an embodiment of the present invention.

FIGS. 6A and 6B show the encoding of a third Unicode string under an embodiment of the present invention.

FIGS. 7A and 7B show the encoding of a forth Unicode string under an embodiment of the present invention.

DETAILED DESCRIPTION OF ILLUSTRATIVE EMBODIMENTS

Figure 1:
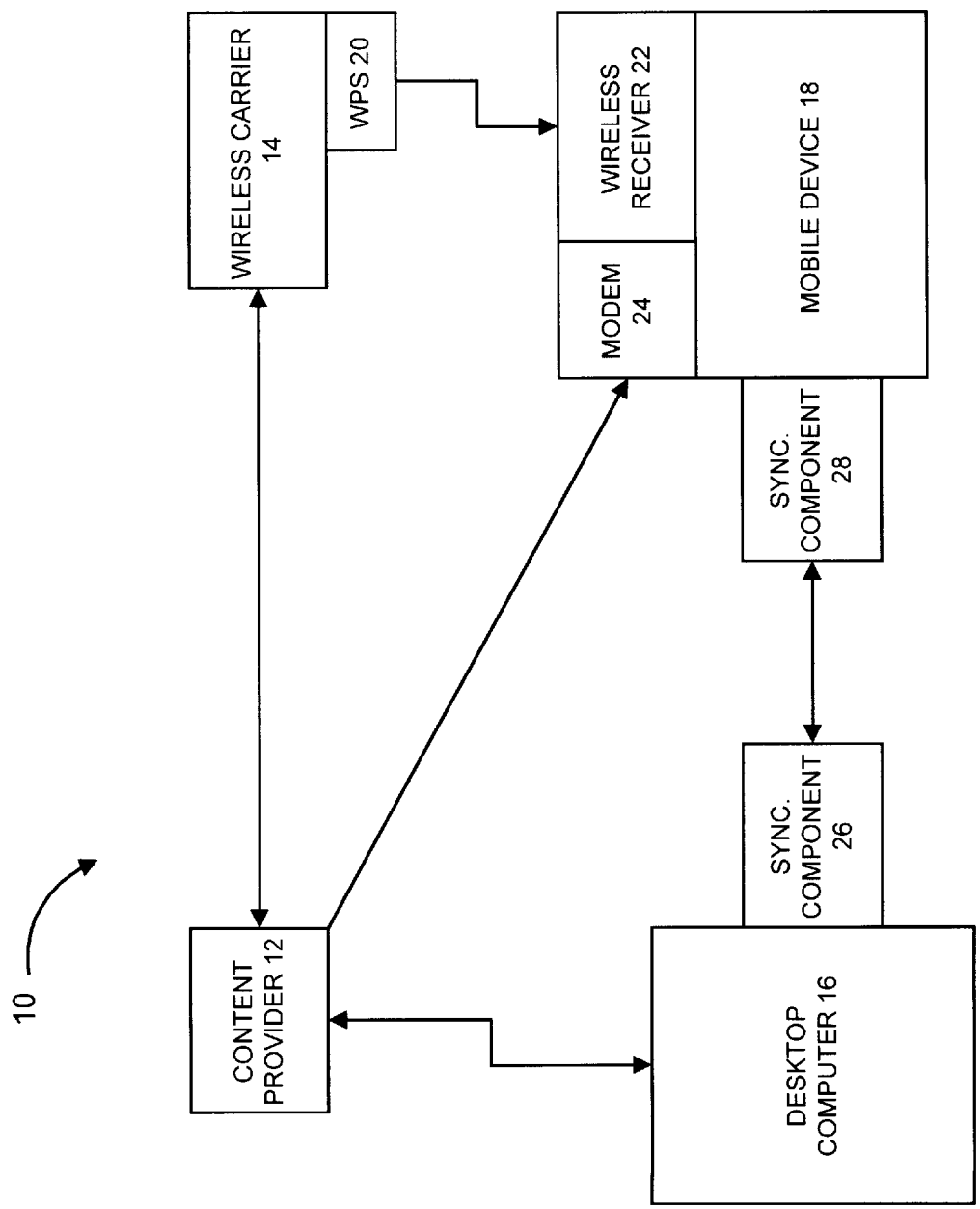
FIG. 1 is a block diagram of a computer system including a wireless device.

FIG. 1 illustrates a system 10 in which the present invention is illustratively implemented. System 10 includes content provider 12, wireless carrier 14, desktop computer 16 and mobile device 18. Content provider 12 provides any suitable type of data from a database or other data source. For example, under the present invention content provider 12 can provide Internet World Wide Web content or current event information such as news, sports, weather, traffic, and stock information. Wireless carrier 14 is configured to receive content from the content provider 12 via dial-up or direct Internet connection, or a network connection. Wireless carrier 14 also includes a wireless push server 20. Server 20 packages the content received from content provider 12 so that it is compatible with the particular type of transport being used by wireless carrier 14. Under the method of the present invention, discussed further below, this includes compressing Unicode character strings before transport. It may also include encrypting and encoding the data before transport.

Once the data is properly formatted, it is transmitted over the air through a wireless network (such as through a paging channel) to be received directly on mobile device 18. The transmitted data is received by a wireless receiver and driver component 22 on mobile device 18 where the data is prepared for use by mobile device 18.

Mobile device 18 also preferably includes a modem 24. Thus, rather than being transmitted through wireless carrier 14, the provider's content can be transmitted directly from provider 12 through a direct dial-up modem connection to mobile device 18.

In one embodiment of the invention, a desktop computer 16 is also provided that can periodically retrieve or receive new and updated data from content provider 12. Computer 16 can render this data on its own associated monitor or in some embodiments, can transmit the data to mobile device 18.

Data on either computer 16 or mobile device 18 can be transmitted to the other device through a synchronization component 26 on computer 16 that is configured to interact with a similar synchronization component 28 on mobile device 18. Once synchronized, the affected data on both computer 16 and mobile device 18 is the same. In some embodiments, mobile device 18 can be synchronized with either desktop computer 16, or another mobile device 18, or both. The connection to other mobile devices can be made using any suitable, and commercially available communication link and using a suitable communications protocol. For instance, in one embodiment, mobile device 18 communicates with either desktop computer 16 or another mobile device 18 with a physical cable, which communicates using a serial communications protocol. Other communication mechanisms are also contemplated by the present invention, such as infrared (IR) communication or other suitable communication mechanisms.

Although wireless device 18 has been described as having the ability to communicate directly with the desktop computer 16 and with content provider 12, those skilled in the art will recognize that less sophisticated mobile devices under the present invention will not have these abilities. In particular, some mobile devices under the present invention do not include a modem, such as modem 24 of FIG. 1, or synchronization component 28 of FIG. 1.

Figure 2:
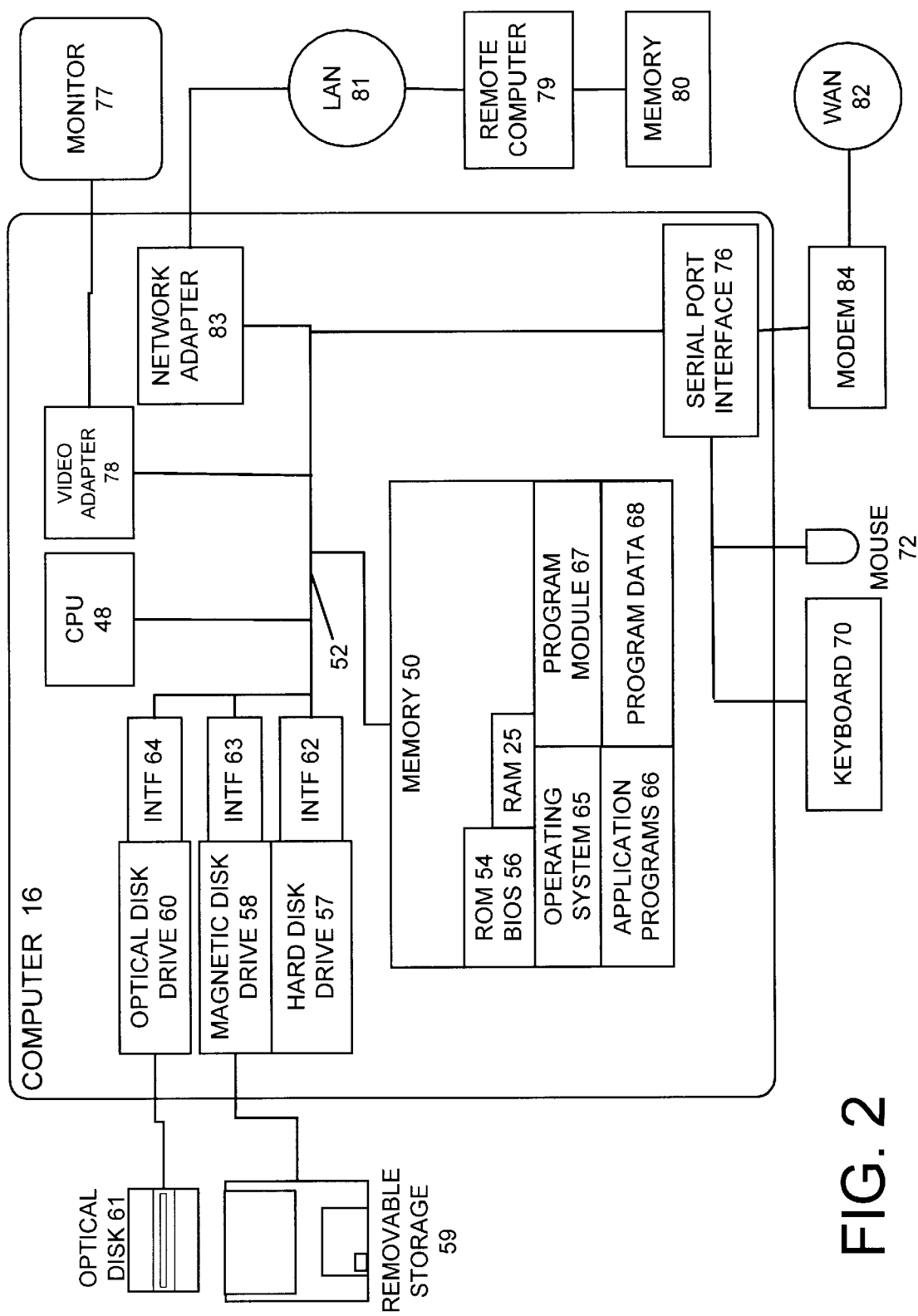
FIG. 2 is a block diagram of a computer of FIG. 1.

FIG. 2 and the related discussion are intended to provide a brief, general description of a suitable desktop computer 16 in which portions of the invention may be implemented. Although not required, the invention will be described, at least in part, in the general context of computer-executable instructions, such as program modules, being executed by a personal computer 16 a wireless push server 20 or mobile device 18. Generally, program modules include routine programs, objects, components, data structures, etc. that perform particular tasks or implement particular abstract data types. Moreover, those skilled in the art will appreciate that desktop computer 16 may be implemented with other computer system configurations, including multiprocessor systems, microprocessor-based or programmable consumer electronics, network PCs, minicomputers, mainframe computers, and the like. The invention may also be practiced in distributed computing environments where tasks are performed by remote processing devices that are linked through a communications network. In a distributed computing environment, program modules may be located in both local and remote memory storage devices.

With reference to FIG. 2, an exemplary system for implementing desktop computer 16 includes a general purpose computing device in the form of a conventional personal computer 16, including processing unit 48, a system memory 50, and a system bus 52 that couples various system components including the system memory 50 to the processing unit 48. The system bus 52 may be any of several types of bus structures including a memory bus or memory controller, a peripheral bus, and a local bus using any of a variety of bus architectures. The system memory 50 includes read only memory (ROM) 54, and a random access memory (RAM) 55. A basic input/output system (BIOS) 56, containing the basic routine that helps to transfer information between elements within the desktop computer 16, such as during start-up, is stored in ROM 54.

The desktop computer 16 further includes a hard disc drive 57 for reading from and writing to a hard disc (not shown), a magnetic disk drive 58 for reading from or writing to removable magnetic disc 59, and an optical disk drive 60 for reading from or writing to a removable optical disk 61 such as a CD ROM or other optical media. The hard disk drive 57, magnetic disk drive 58, and optical disk drive 60 are connected to the system bus 52 by a hard disk drive interface 62, magnetic disk drive interface 63, and an optical drive interface 64, respectively. The drives and the associated computer readable media provide nonvolatile storage of computer readable instructions, data structures, program modules and other data for the desktop computer 16. Although the exemplary environment described herein employs a hard disk, a removable magnetic disk 59, and a removable optical disk 61, it should be appreciated by those skilled in the art that other types of computer readable media that can store data and that is accessible by a computer, such as magnetic cassettes, flash memory cards, digital video disks (DVDs), Bernoulli cartridges, random access memories (RAMs), read only memory (ROM), and the like, may also be used in the exemplary operating environment.

A number of program modules may be stored on the hard disk, magnetic disk 59, optical disk 61, ROM 54 or RAM 55, including an operating system 65, one or more application programs 66 (which may include PIMs), other program modules 67 (which may include synchronization component 26), and program data 68.

A user may enter commands and information into desktop computer 16 through input devices such as a keyboard 70, pointing device 72 and microphone 74. Other input devices (not shown) may include a joystick, game pad, satellite dish, scanner, or the like. These and other input devices are often connected to processing unit 48 through a serial port interface 76 that is coupled to the system bus 52, but may be connected by other interfaces, such as a sound card, a parallel port, game port or a universal serial bus (USB). A monitor 77 or other type of display device is also connected to the system bus 52 via an interface, such as a video adapter 78. In addition to the monitor 77, desktop computers may typically include other peripheral output devices such as speakers or printers.

Desktop computer 16 may operate in a networked environment using logic connections to one or more remote computers (other than mobile device 18), such as a remote computer 79. The remote computer 79 may be another personal computer, a server, a router, a network PC, a peer device or other network node, and typically includes many or all of the elements described above relative to desktop computer 16, although only a memory storage device 80 has been illustrated in FIG. 2. The logic connections depicted in FIG. 2 include a local area network (LAN) 81 and a wide area network (WAN) 82. Such networking environments are commonplace in offices, enterprise-wide computer network intranets and the Internet.

When used in a LAN networking environment, desktop computer 16 is connected to the local area network 81 through a network interface or adapter 83. When used in a WAN networking environment, desktop computer 16 typically includes a modem 84 or other means for establishing communications over the wide area network 82, such as the Internet. The modem 84, which may be internal or external, is connected to the system bus 52 via the serial port interface 76. In a network environment, program modules depicted may be stored in the remote memory storage devices. It will be appreciated that the network connections shown are exemplary and other means of establishing a communications link between the computers may be used.

Desktop computer 16 runs operating system 65, which is typically stored in non-volatile memory 54 and executes on processor 48. One suitable operating system is a Windows brand operating system old by Microsoft Corporation, such as Windows 95 or Windows NT, operating systems, other derivative versions of Windows brand operating systems, or another suitable operating system. Other suitable operating systems include systems such as the Macintosh OS sold from Apple Corporation, and the OS/2 Presentation Manager sold by International Business Machines (IBM) of Armonk, N.Y.

Application programs are preferably stored in program module 67, in volatile memory or non-violatile memory, or can be loaded into any of the components shown in FIG. 2 from disc drive 59, CDPOM drive 61, downloaded from a network via network adapter 83, or loaded using another suitable mechanism.

A dynamically linked library (DLL), comprising a plurality of executable functions is associated with PIMs in the memory for execution by processor 48. Interprocessor and intercomponent calls are facilitated using the component object model (COM) as is common in programs written for Microsoft Windows brand operating systems. Briefly, when using COM, a software component such as DLL has a number of interfaces. Each interface exposes a plurality of methods, which can be called individually to utilize different services offered by the software component.

In addition, interfaces are provided such that methods or functions can be called from other software components, which optionally receive and return one or more parameter arguments.

Figure 3A:
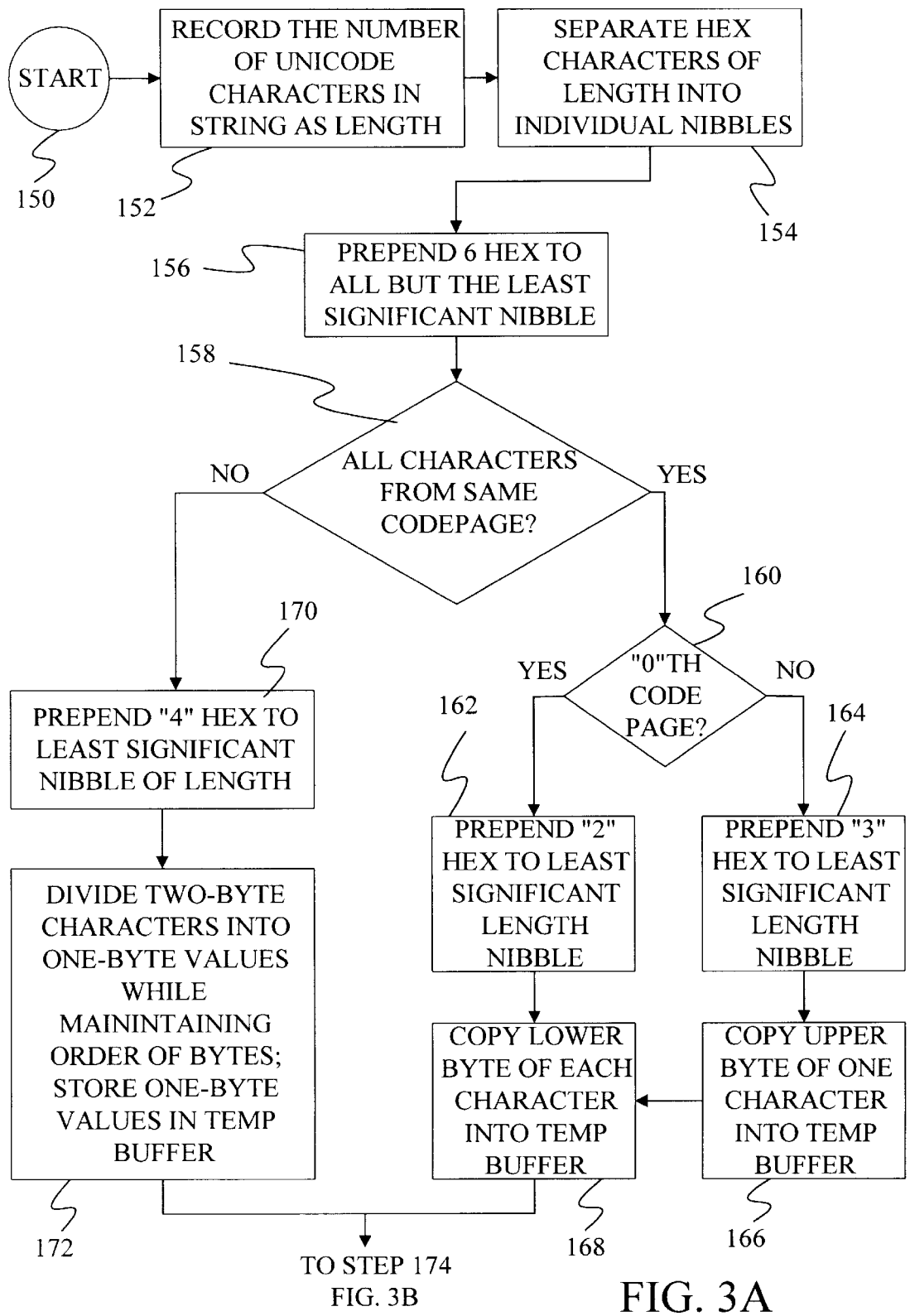
FIGS. 3A and 3B are flow diagrams of a method of an embodiment of the present invention.
Figure 3B:
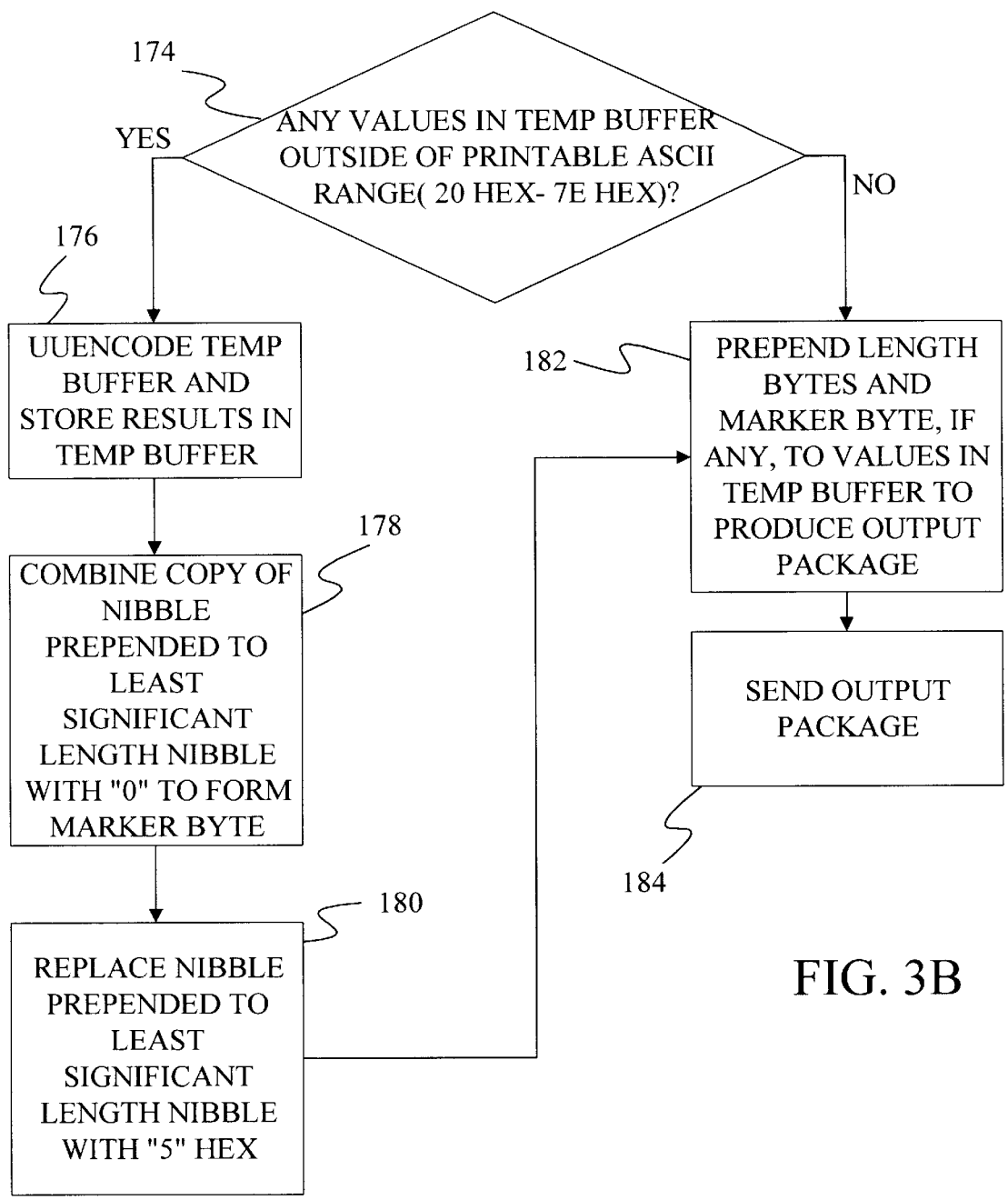

FIGS. 3A and 3B provide a flow diagram of a method under one embodiment of the present invention.

The method starts at step 150 of FIG. 3A and proceeds to step 152 where one less than the number of Unicode characters in the string is recorded as the length. The length is not the total number of characters in the string because the last Unicode character typically contains all zeros to mark the end of the string. Thus, it does not contain a Unicode character that represents a language symbol. Under the present invention, this last Unicode character is no longer needed since the length of the Unicode strength is passed through the transmission channel. Therefore, the last Unicode character in the string is not included in the length of the string.

The recorded length of the Unicode string is then separated into individual hexadecimal nibbles at step 154. Thus, if the length of the Unicode string is "2C" hexadecimal, the recorded length would be separated into a most significant hexadecimal nibble of "2" and a least significant hexadecimal nibble of "C". A hexadecimal "6" is prepended to the front of all of the length nibbles except for the least significant length nibble. In the example above, a "6" would be prepended to the "2" to produce the length byte "62" but a "6" would not be prepended to the "C" nibble, which is the least significant length nibble. This prepending takes place at step 156 of FIG. 3A.

At step 158 of FIG. 3A, the characters in the Unicode string are each examined to determine if they are all from the same code page. Under the Unicode standard, each Unicode character is constructed from two eight-bit bytes and two Unicode characters are from the same code page if their first bytes match. Thus, in step 158, the method examines the first byte of each Unicode character in the Unicode string to determine if the first bytes are the same.

If the Unicode characters of the Unicode string are each from the same code page, the method continues at step 160 where the method determines if the Unicode characters are each from the 0th code page. Unicode characters from the 0th code page each have "00" hexadecimal as their first byte. In addition, the 0th code page contains all of the printable "ASCII" character set. Thus, under the Unicode standard, "ASCII" characters translate directly to a Unicode character simply by prepending "00" to the front of the "ASCII" character.

If all of the Unicode characters in the string are from the 0th code page at step 160, "2" hexadecimal is prepended to the least significant length nibble at step 162. Recall that at step 156 above, nothing was prepended to the least significant length nibble, however, the other length nibbles had a "6" prepended to them.

If the Unicode characters are not all from the 0th code page at step 160, the method continues at step 164 where "3" hexadecimal is prepended to the least significant length nibble. A copy of the first byte of one of the Unicode characters in the string of Unicode characters is then placed in a temporary buffer at step 166. Thus, if the first byte of each of the Unicode characters in the string was "B2", "B2" will be copied into the temporary buffer.

After step 162 or step 166, the lower byte in each character in the Unicode character string is copied into the temporary buffer at a step 168.

Through steps 160, 162, 164, 166, and 168, a Unicode string consisting of Unicode characters that have the same first byte is reduced to a string of single byte values consisting of the second byte of each Unicode character. To indicate the value of the striped first byte, a designation value is added to the string of single byte values. For Unicode characters from the 0th code page, the designation value is simply the "2" prepended to the least significant length nibble. For Unicode characters that share other code pages, the designation value is a composite of the "3" prepended to the least significant length nibble in step 164 and the single copy of the upper byte of the Unicode characters that is stored in the temporary buffer at step 166. By examining this single upper byte, it is possible to determine the code page for the Unicode characters that were converted into single bytes under this embodiment of the present invention.

If at step 158 all of the characters are not from the same Unicode code page, the method continues at step 170 where a "4" hexadecimal is prepended to the least significant length nibble. Afterwards, at step 172, the two-byte Unicode characters are divided into one-byte values while maintaining the order of the bytes in the Unicode string. The one-byte values are then stored in a temporary buffer.

After step 168 or after step 172, the method continues at step 174 of FIG. 3B, where the values in the temporary buffer are examined to determine if any of the values are outside of the printable "ASCII" range consisting of hexadecimal values between "20" hexadecimal and "7E" hexadecimal. If any of the values in the temporary buffer are outside the printable "ASCII" range, the method continues at step 176 where the entire contents of the temporary buffer is UUencoded. The results of the UU encoding are then stored back in the temporary buffer. Afterwards, at step 178, the nibble prepended to the least significant length nibble is copied as the first nibble of a byte ending in "0" hexadecimal. This forms a marker byte that indicates whether the Unicode characters were from the same Unicode code page. Thus, if a "3" had been prepended to the least significant length nibble, the "3" would be copied to produce a marker byte of "30", which indicates that the Unicode characters all came from the same code page and that the code page was different than the 0th code page.

After the marker byte has been formed in step 178, the nibble prepended to the least significant length nibble is changed to "5" hexadecimal at a step 180. Thus, if the least significant length nibble was "C", and it had a "2" prepended to it at step 162 to form a byte "2C", step 180 would replace the "2" with a "5" to produce a byte "5C".

After step 180 or if all of the values in the temporary buffer are in the printable "ASCII" range at step 174, the method continues at step 182 where the output data package is constructed. Under this embodiment of the invention the output package includes the length bytes, the marker byte if any, and the values in the temporary buffer. The length bytes consist of length nibbles prepended by "6" hexadecimal and the least significant length nibble prepended by a designation number. In some cases, the designation number indicates what type of Unicode compression was performed on the Unicode characters. For example, if the designation number is "2" hexadecimal, the Unicode characters were all from the 0th code page and were compressed by removing their first or upper byte, which as "00" hexadecimal. If the designation number is "3", the Unicode characters were all from the same code page but not the 0th code page. In addition the Unicode characters were compressed by removing their common first byte. If the designation number is "4", the Unicode characters were not from the same code page and thus were not compressed.

Alternatively, the designation number can indicate whether the values accompanying the length bytes were UUencoded. If the values were UUencoded, the designation number is "5" hexadecimal and the output package includes a marker byte. The marker byte has a value of "20", "30" or "40" hexadecimal corresponding to the designation numbers "2", "3", and "4" discussed above. Thus, the marker byte indicates the type of Unicode compression performed on the Unicode characters before the UUencoding took place.

At step 184, the output package is sent through the transmission channel.

FIGS. 4A and 4B show an example of the conversion of a Unicode string 200, shown in FIG. 4A, into a compressed string 202, shown in FIG. 4B, under the embodiment of the present invention described above. Unicode string 200 of FIG. 4A includes 19 Unicode characters and a Unicode string delimiter character 204, having a value of "0000", which is located at the end of the Unicode string. Thus, the length of the Unicode string is "19" decimal or "13" hexadecimal. Under the method of one embodiment of the present invention, the two hexadecimal nibbles that represent the length are divided into separate nibbles and the most significant nibble has a "6" prepended to it to produce length byte 206 of output package 202. This results in a value of "61" hexadecimal for length byte 206.

Since each of the Unicode bytes in Unicode string 200 is from the same code page and in fact is from the 0th code page, a "2" is prepended to the least significant length nibble, which has a value of "3", to produce least significant length byte 208, which has a value of "23" hexadecimal.

The remaining nineteen bytes of output package 202 are the second or lower bytes of the Unicode characters in Unicode string 200. Thus, byte 210 of output package 202 is "43", which is the second byte of Unicode character 212 of Unicode string 200. Similarly, byte 214 of output package 202 is "32", which is the second byte of Unicode character 216 of Unicode string 200. Note that since each of the characters come from the 0th code page, a separate byte is not needed to designate their common code page. Instead, the "2" prepended to the least significant length nibble indicates that the Unicode characters were each from the 0th code page.

FIGS. 5A and 5B show another Unicode string 230 and its resultant compressed string 232 after following the process of the present invention. Unicode string 230 includes nineteen Unicode characters and one Unicode string delimiter byte 234, which contains all zeros. As in the example of FIGS. 4A and 4B, the hexadecimal representation of the length of Unicode string 230 is "13", which is separated into individual nibbles and has a "6" prepended to the most significant nibble to produce length byte 238 of compressed string 232. Although each of the Unicode characters in Unicode string 230 is from the same code page, they are not from the 0th code page. Instead, they are each from the "40" code page. Thus, instead of prepending a "2" to the least significant length nibble, the embodiment of the present invention prepends a "3" to the least significant length nibble. This creates least significant length byte 236, which has a value of "33". This byte is placed after most significant length byte 238 in compressed string 232.

Since the Unicode characters are not all from the 0th code page, the code page must be identified by a byte in compressed string 232. This is accomplished in step 166 of FIG. 3A by copying the common first byte of each of the Unicode characters in Unicode string 230 into a designation byte 240, which has a value of "40" in compressed string 232.

The remaining bytes in compressed string 232 are simply the second bytes of each of the Unicode characters in Unicode string 230. Thus, byte 242 of compressed string 232 is the second byte of Unicode character 244 of Unicode string 230. Note that the bytes in compressed string 232 are organized in the Dame order as they appear in Unicode string 230. Thus, byte 242 is the second character byte in compressed string 232 and corresponds to Unicode character 244, which is the second Unicode character Unicode string 230.

FIG. 6A shows a Unicode string 260 that is converted into an output package 262 shown in FIG. 6B. Unicode string 260 includes four Unicode characters and a Unicode string delimiter 264 that marks the end of Unicode string 260. In Unicode string 260, Unicode characters 266 and 268 are from code page "40" and Unicode characters 270 and 272 are from code page "50". Since Unicode characters 266 and 268 are from a different code page than Unicode characters 270 and 272, Unicode string 260 can not be compressed by removing a common code page byte. Thus, for the example of FIG. 6A, the method of FIG. 3A proceeds from step 158 to step 170. Thus, a "4" is prepended to the least significant length nibble, which is also "4", to form length byte 274, which has a value of "44" in output package 262.

To form the remainder of output package 262, the Unicode characters of Unicode string 260 are broken apart into individual bytes and placed in output package 262 in the same order as they appear in Unicode string 260.

FIGS. 7A, 7B, and 7C show the progression of a Unicode string 290 through a method of the present invention in which a portion of the Unicode string must be UUencoded. In FIG. 7A, Unicode string 290 is shown as having four Unicode characters 292, 294, 296, and 298 as well as a Unicode string delimiter 300. As in Unicode string 260 of FIG. 6A, Unicode string 290 of FIG. 7A includes Unicode characters from multiple code pages. In particular, Unicode characters 292 and 294 are from Unicode page "40" and Unicode characters 296 and 298 are from Unicode page "10". As such, Unicode string 290 can not be compressed by removing common code pages and the two bytes of each Unicode character are placed directly into the output package.

FIG. 7B depicts an intermediate package 310 that contains a length byte 312 and a byte string 314. Byte string 314 consists of each of the bytes found in Unicode string 290 in the order that they appear in Unicode string 290. Length byte 312 includes the least significant length nibble, "4", in its lower byte and the hexadecimal value "4" in its upper byte, which denotes that all of the characters in the Unicode string were not from the same Unicode page. Intermediate package 310 represents the state of an output package produced by the method of FIGS. 3A and 3B after step 172 of FIG. 3A.

In step 174 of FIG. 3B, byte string 314 is examined to determine if any of the bytes are outside of the printable "ASCII" range. In byte string 314, bytes 316, and 318 are outside of the printable "ASCII" range since each has a value of "10" hexadecimal. Therefore, under the method of FIG. 3B, byte string 314 is Uuencoded at step 176. The results of such UUencoding are shown in FIG. 7C as Uuencoded string 324 of output package 326.

Output package 326 also includes a marker byte 328 formed by copying the upper nibble 320 of length byte 312 and prepending the copy to a "0" nibble. Output package 326 also includes a length byte 330 that is formed by prepending "5" to lower nibble 322 of length byte 312 of FIG. 7B.

From the discussion above, it can be seen that upper nibble 334 of length byte 330 indicates that the Unicode string was Uuencoded. Lower nibble 336 of length byte 330 indicates the length of the original Unicode string. Byte 328 of output package 326 indicates that before the Unicode string was Uuencoded, it was not Unicode compressed under the present invention but instead was simply split into individual bytes.

Those skilled in the art will recognize that marker byte 328 could also be "30" if the Unicode string contained Unicode characters from the same code page that were not from the 0th code page. In addition, marker byte 328 could be "20" if the Unicode string only contained Unicode characters from the 0th code page. In addition, those skilled in the art world will recognize that for longer Unicode strings, the length of the Unicode string can be represented by multiple length bytes. The more significant length bytes would all begin with "6" and end with a nibble indicative of a nibble of the length. In these cases, if the byte string is UUencoded, the least significant length byte contains a "5" in its upper nibble and indicates that the Unicode string was Uuencoded.

Figure 8A:
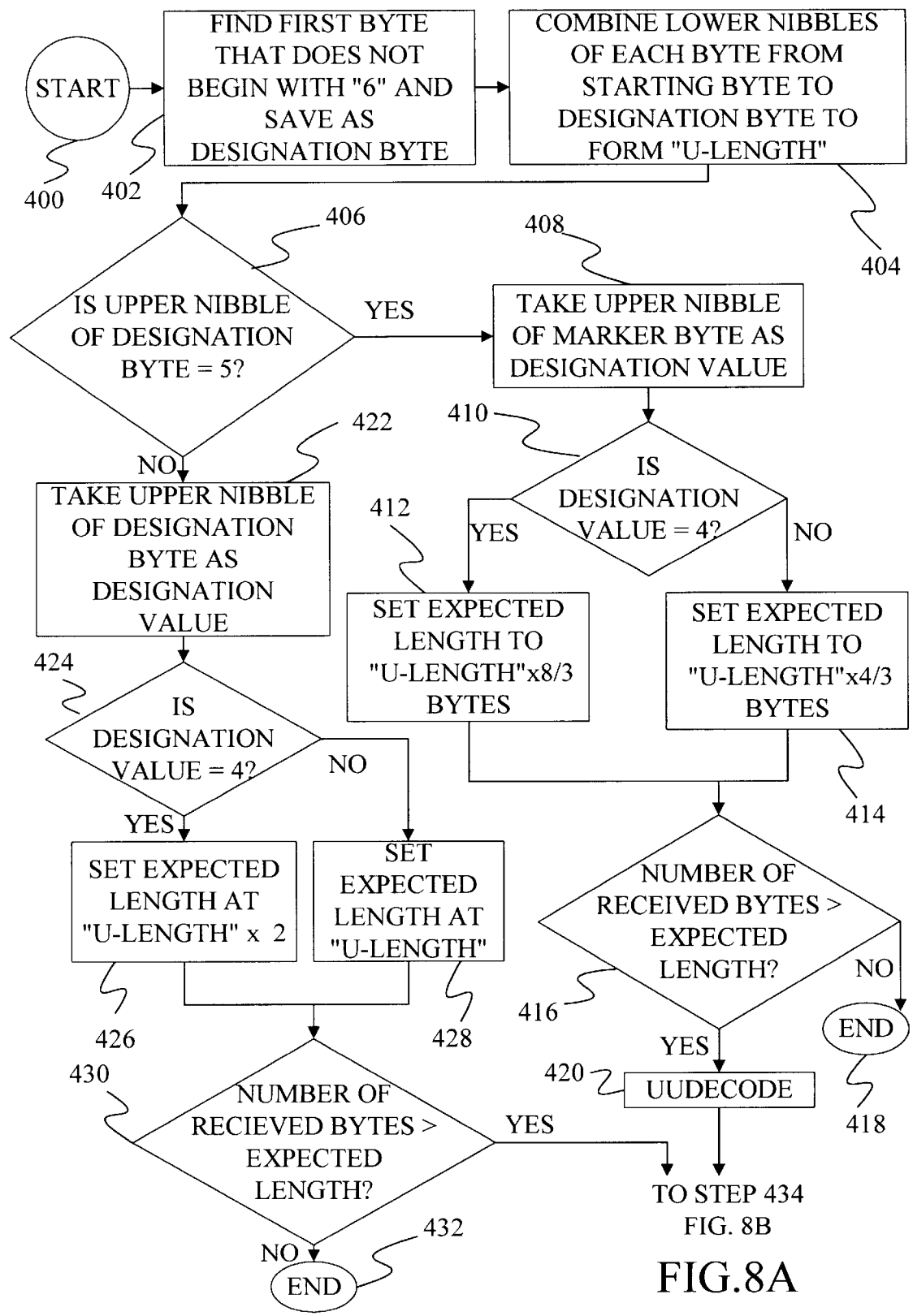
FIGS. 8A and 8B are flow diagrams of a method of reconstructing a Unicode string from a data packet of the present invention.
Figure 8B:
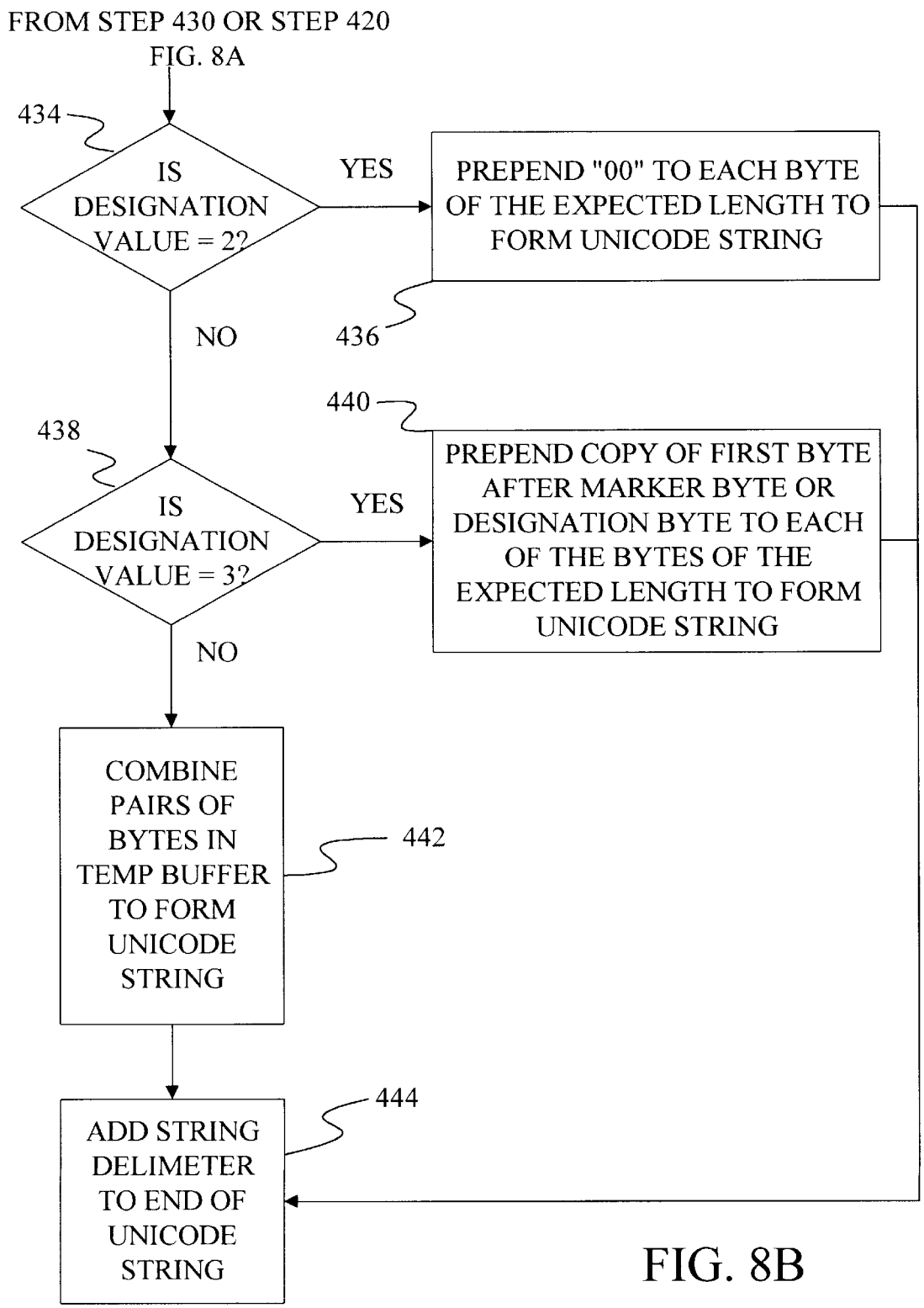

FIGS. 8A and 8B are flow diagrams of a method under one embodiment of the present invention for decompressing Unicode strings that have been compressed through the method of FIGS. 3A and 3B. The method begins at step 400 of FIG. 8A and proceeds to step 402 where the first byte in the input string that does not begin with "6" hexadecimal is located and saved as the designation byte. At step 404, the lower nibbles of each byte between and including the starting byte and the designation byte are combined to form the Unicode length (U-length) of the Unicode string. This represents the number of Unicode characters that were in the original string.

After step 404, the method examines the upper nibble of the designation byte at step 406. If the upper nibble is equal to "5" at step 406, the Unicode string has been UUencoded and the method continues at step 408 where the upper nibble of the marker byte is used as a designation value. In this context, the marker byte is the next byte in the input string after the designation byte. The designation value is then checked at step 410 to determine if it is equal to "4". If it is equal to "4", the Unicode characters are not from the same code page and the method continues at step 412, where an expected length is determined for the received string. The expected length is the number of bytes that the received string needs in order to completely represent the entire Unicode string. If the Unicode characters were not from the same code page at step 410, the expected length determined at step 412 is calculated by multiplying the length of the Unicode string by eight and dividing the product by three. The values of eight and three are based on two components. First, for every three bytes that are UUencoded, four bytes of UUencoded data are produced. This produces an encoding ratio of 4/3. This encoding ratio is then multiplied by two to represent that fact that for every one Unicode character there are two bytes that are UUencoded if the Unicode characters are not from the same code page. Thus, 2 times 4/3 produces the 8/3 scaling component that is multiplied by the Unicode Length to produce the expected length at step 412.

If at step 410 the designation value is not "4", the expected length is determined at step 414 by multiplying the Unicode Length by four and dividing the product by three. The "4/3" value represents the encoding ratio of UUencoding. Note that since the designation value is not "4", each of the Unicode characters is from the same code page such that the number of bytes that were UUencoded equals the number of characters in the Unicode string.

At step 416, the number of received bytes is compared against the expected length. This comparison is done to determine if the receiver has enough data to recreate the Unicode string. If the number of received bytes is not greater than or equal to the expected length, the receiver does not have enough data to recreate the Unicode string. This causes the process to end at step 418. If the number of received bytes is greater than or equal to the expected length at step 416, the receiver has enough data to recreate the Unicode string and the received bytes are UUdecoded at step 420. If the number of received bytes exceeds the expected length, only the number of received bytes set by the expected length are UUdecoded.

Returning to step 406, if the upper nibble of the designation byte is not "5", the Unicode string has not been UUencoded. This means that the upper nibble of the designation byte should be used as the designation value, which occurs at step 422. At step 424, the designation value is compared against "4" to determine if all of the Unicode characters in the Unicode string are from the same code page. If the designation value is equal to "4", the Unicode characters of the Unicode string are from different code pages and the process continues at step 426 where the expected length is set to two times the Unicode length. The expected length of step 426 is twice the Unicode length because each Unicode character is divided into two bytes before being sent to the receiver if the Unicode characters are not from the same code page.

If the Unicode characters are from the same code page at step 424, the process continues at step 428 where the expected length is set equal to the Unicode length.

After step 426 or step 428, the process continues at step 430 where the number of received bytes is compared against the expected length. If the number of received bytes is not greater than or equal to the expected length, the receiver does not have enough data to recreate the Unicode string and the process ends at step 432. If the number of received bytes is greater than or equal to the expected length at step 430, the receiver has enough data to recreate the Unicode string.

If the number of received bytes exceeds the expected length at step 430 or after step 420 of FIG. 8A, the process continues at step 434 of FIG. 8B where the designation value is compared to "2" hexadecimal. If the designation value is equal to "2", all of the Unicode characters in the Unicode string are from the 0th code page. To reconstruct the Unicode characters from the received bytes, "00" hexadecimal is prepended to each of the received bytes at step 436. If the number of received bytes exceeds the expected length, the number of received bytes used to reconstruct the Unicode string is limited to the expected length.

If the designation value is not equal to "2" hexadecimal at step 434, the process continues at step 438 where the designation value is compared to "3" hexadecimal. If the designation value is equal to "3", all of the Unicode characters are from the same code page. Recall that the common code page for the Unicode characters is included as a common code page byte in the transmitted package. If a marker byte is present, indicating UUencoding, the common code page byte appears after the marker byte. If the marker byte is not present, the common code page byte appears after the designation byte. Thus, to reconstruct the Unicode characters, the first byte after the marker byte or the first byte after the designation byte is prepended to the received bytes. This occurs at step 440.

If the designation value is not "3" at step 438, the Unicode characters do not share a common code page. As such, both bytes of each Unicode character are included in the transmitted string. To reconstruct the Unicode characters, pairs of bytes in the transmitted string are combined to create individual Unicode characters.

After step 436, 440 or 442, the process continues at step 444 where a string delimiter equal "0000" hexadecimal is added to the end of the Unicode string.

Although the present invention has been described with reference to preferred embodiments, workers skilled in the art will recognize that changes may be made in form and detail without departing from the spirit and scope of the invention.

What is claimed is:

1. In a computer system, a computer-readable medium having computer-executable instructions for performing steps comprising:
   for a starting string of two-byte characters, determining if the first byte in each of the two-byte characters is the same byte;
   converting the starting string of two-byte characters into a string of one-byte values by removing the first byte in each of the two-byte characters of the starting string if the first byte is the same in each of the two-byte characters of the starting string; and
   concatenating a designation value to the string of one-byte values to indicate the value of the first byte removed from each two-byte character, the designation value and the string of one-byte values providing a complete description of the starting string regardless of the value of the second byte of the two-byte characters.

2. The computer-readable medium of claim 1 wherein each two-byte character is a Unicode character.

3. The computer-readable medium of claim 2 wherein the designation value comprises a designation nibble and a length nibble.

4. The computer-readable medium of claim 3 wherein the designation value further comprises a page byte.

5. The computer-readable medium of claim 4 wherein the page byte is the same as the first byte.

6. The computer-readable medium of claim 1 wherein if the first byte of each of the two-byte characters is not the same, the computer-executable instructions perform steps comprising dividing the two-byte characters to form a non-compressed string of one-byte values and prepending a designation value to the non-compressed string of one-byte values, the designation value indicating that the first bytes of the two-byte values were not the same in the starting string.

7. The computer-readable medium of claim 6 having further computer-executable instructions for performing a further step comprising examining the non-compressed string of one-byte values to determine if each byte in the non-compressed string of one byte values has a value between 20 hexadecimal and 7E hexadecimal.

8. The computer readable medium of claim 7 wherein if each one-byte value is not between 20 hexadecimal and 7E hexadecimal the entire non-compressed string of one-byte values is UUencoded.

9. The computer-readable medium of claim 1 having further computer-executable instructions for performing a further step comprising examining the string of one-byte values to determine if each one-byte value is between 20 hexadecimal and 7E hexadecimal.

10. The computer-readable medium of claim 9 wherein if each one-byte value is not between 20 hexadecimal and 7E hexadecimal, the entire string of one-byte values is UUencoded.

11. The computer-readable medium of claim 1 having further computer executable instructions for performing a step of combining a length value with the string of one-byte values and the designation value, the length value indicative of the number of two-byte characters in the starting string.

12. The computer-readable medium of claim 11 wherein the designation value comprises a designation nibble and the length value comprises a length nibble, the designation nibble and the length nibble combined to form a designation byte.

13. The computer-readable medium of claim 12 wherein the length value further comprises a more significant length nibble, the more significant length nibble concatenated with a length designation nibble to form a length byte.

14. A method of encoding a string of two-byte values, each two-byte value having a first byte and a second byte, the method comprising:
   comparing the first byte of one of the two-byte values in the string to the first byte of each of the other two-byte values to determine if the first bytes are the same;
   if the first bytes are the same, creating a designation value indicative of the first bytes of each of the two-byte values;
   stripping the first byte from each of the two-byte values to produce a string of one-byte values; and
   combining the designation value and the string of one-byte values with a length value to produce an encoded string.

15. The method of claim 14 wherein the designation value comprises a four-bit value.

16. The method of claim 14 wherein the designation value comprises an eight-bit byte that has the same value as the first byte stripped from the two-byte values.

17. The method of claim 14 further comprising steps of:
   determining if any of the one-byte values is outside of a range of values; and encoding at least a portion of the string of one-byte values to produce an encoded string if any of the one-byte values is outside of the range, the encoded string comprising a string of one-byte values, each one-byte value within the range of values.

18. The method of claim 17 wherein the range of values is from 20 hexadecimal to 7E hexadecimal.

19. The method of claim 14 wherein if the first bytes of the two-byte values are not the same the method further comprises a step of dividing each two-byte value into two one-byte values.

20. In a computer system, a data structure in a computer-readable format, the data structure comprising:

a data component that at least partially represents a string of input characters; and a length component comprising a designation value and a length value, the designation value indicating whether the data component was formed by removing respective portions from each character in the string of input characters and the length value indicative of the number of characters in the input string.

21. The data structure of claim 20 wherein the input characters comprise two-byte values each having an upper byte and a lower byte, and the data component comprises one-byte values that are equal to the respective lower bytes.

22. The data structure of claim 21 wherein the upper byte of each input character is the same.

23. The data structure of claim 22 wherein the designation value comprises a first designation portion that indicates that a copy of the upper byte of each input character is included in the data packet.

24. The data structure of claim 23 wherein the designation value further comprises a second designation portion that is the copy of the upper byte of each input character.

25. The data structure of claim 20 wherein the designation value comprises a UUencode portion that indicates that portions of the data component have been UUencoded.

26. In a wireless device, a method for reconstructing an original data packet from a received data packet, the method comprising:

determining the length of the original data packet from a value in the received data packet;

determining if a common byte was stripped from a plurality of portions of the original data to form the received data packet;

inserting the stripped common byte into the received packet at a plurality of positions to form the original data.

27. The method of claim 26 wherein the received packet comprises a designation value indicating that a common byte was stripped from the original data and indicating the value of the stripped byte.

28. The method of claim 27 wherein the original data comprises Unicode characters.

* * * * *

UNITED STATES PATENT AND TRADEMARK OFFICE
CERTIFICATE OF CORRECTION

PATENT NO. : 6,166,666
DATED : December 26, 2000
INVENTOR(S) : Don Kadyk

It is certified that error appears in the above-identified patent and that said Letters Patent is hereby corrected as shown below:

Column 5,
Line 10, change "old" to -- sold --.
Line 21, change "CDPOM" to -- CDROM --.

Column 6,
Line 30, change "Tn" to -- In --.

Column 8,
Line 41, change "Dame" to -- same --.
Line 44, insert -- in -- after "character".

Column 11,
Line 38, insert -- to -- after "equal".

Column 14,
Line 16, insert -- and -- after ";".

Signed and Sealed this

Sixth Day of November, 2001

Attest:

NICHOLAS P. GODICI
*Attesting Officer*    *Acting Director of the United States Patent and Trademark Office*